US010187005B2

(12) United States Patent
Rodrigues et al.

(10) Patent No.: US 10,187,005 B2
(45) Date of Patent: Jan. 22, 2019

(54) SOLAR ROOF PANEL SYSTEM WITH EDGE AND SURFACE TREATMENTS

(71) Applicant: Building Materials Investment Corporation, Dallas, TX (US)

(72) Inventors: Tommy F. Rodrigues, Nutley, NJ (US); Sudhir Railkar, Wayne, NJ (US); Daniel E. Boss, Murphy, TX (US); David J. Gennrich, Fitchburg, WI (US); Cory Boudreau, Lake Elmo, MN (US); Daniel R. Nett, Sun Prairie, WI (US); Kent J. Kallsen, Jefferson, WI (US)

(73) Assignee: Building Materials Investment Corporation, Dallas, TX (US)

( * ) Notice: Subject to any disclaimer, the term of this patent is extended or adjusted under 35 U.S.C. 154(b) by 809 days.

(21) Appl. No.: 14/042,789

(22) Filed: Oct. 1, 2013

(65) Prior Publication Data

US 2014/0090695 A1     Apr. 3, 2014

Related U.S. Application Data

(60) Provisional application No. 61/708,237, filed on Oct. 1, 2012.

(51) Int. Cl.
| | |
|---|---|
| *H02S 20/23* | (2014.01) |
| *H02S 30/10* | (2014.01) |
| *H01L 31/0236* | (2006.01) |
| *H02S 20/25* | (2014.01) |
| *H01L 31/02* | (2006.01) |

(52) U.S. Cl.
CPC ........ *H02S 20/23* (2014.12); *H01L 31/02366* (2013.01); *H02S 20/25* (2014.12); *H02S 30/10* (2014.12); *H01L 31/02* (2013.01); *Y02B 10/12* (2013.01)

(58) Field of Classification Search
CPC .......... H02S 20/23–20/25; H02S 30/10; H01L 31/02366
USPC ........................................ 136/244, 251, 259
See application file for complete search history.

(56) References Cited

U.S. PATENT DOCUMENTS

| | | | | |
|---|---|---|---|---|
| 4,287,382 A | * | 9/1981 | French | H01L 31/048 136/244 |
| 5,019,176 A | * | 5/1991 | Brandhorst, Jr. | H01L 31/022425 136/244 |
| 5,316,592 A | * | 5/1994 | Dinwoodie | E04D 11/02 136/244 |

(Continued)

*Primary Examiner* — Allison Bourke
(74) *Attorney, Agent, or Firm* — Womble Bond Dickinson (US) LLP (57) ABSTRACT

A roof-mounted solar power system for generating electrical power that includes a plurality of solar modules adapted for generating electrical power from sunlight, and with each of the plurality of solar modules having substantially the same size, aspect ratio and surface coloring. The plurality of solar modules are mounted on the deck of a roof to form a bank of solar modules having at least one irregular edge. The solar power system further includes one or more non-power generating edge treatments having substantially the same size, aspect ratio and surface coloring as the solar modules and that are adapted for installation along the irregular edge. Each edge treatment is adapted for a cutting away of at least one corner thereof to smooth the irregular edge of the bank of solar modules to a regular edge.

15 Claims, 4 Drawing Sheets

(56) References Cited

U.S. PATENT DOCUMENTS

| | | | | |
|---|---|---|---|---|
| 5,725,006 A | * | 3/1998 | Kawama | H01L 31/0236 136/251 |
| 2008/0006323 A1 | * | 1/2008 | Kalkanoglu | H01L 31/048 136/253 |
| 2009/0000221 A1 | * | 1/2009 | Jacobs | H01L 31/0482 52/173.3 |
| 2009/0229652 A1 | * | 9/2009 | Mapel | H01L 31/055 136/246 |
| 2010/0326488 A1 | * | 12/2010 | Aue | H01L 31/02 136/244 |

* cited by examiner

SOLAR ROOF PANEL SYSTEM WITH EDGE AND SURFACE TREATMENTS

RELATED APPLICATIONS

This application claims the benefit of U.S. Provisional Patent Application No. 61/708,237, filed on 1 Oct. 2012, and entitled "Solar Roof Panel System With Edge And Surface Treatments", which application is incorporated by reference in its entirety herein.

TECHNICAL FIELD

This application relates generally to solar power and more specifically to electric solar collectors for placement on the shingled roof of a structure such as a residential home.

BACKGROUND

The trend toward alternate energy sources has lead in recent years to a demand for wind, geothermal, solar, hydrogen, and other sources of energy that do not derive from fossil fuels. The capturing of solar energy includes, without limitation, the collection and storage of heat from the sun and the collection and storage of electricity derived from sunlight. In the later case, solar cells and multi-cell solar modules have been developed that convert sunlight directly into electrical energy, which then may be used, stored in batteries, and/or placed back on the electrical grid. While solar modules are feasible in many applications, such as on industrial and commercial buildings, some consider them unsightly for use on roofs of residential homes. Further, traditional solar modules cover the shingles of a residential home, obscuring the architectural contribution of the shingles to the home. There is a need for a system to collect solar energy from the roof of a residential home that is not unsightly and that is integrated into and actually enhances the architectural appearance of the shingles of the home. It is to the provision of such a system that the present invention is primarily directed.

SUMMARY

Briefly described, one embodiment of the present disclosure comprises a roof-mounted solar power system for generating electrical power from sunlight. The solar power system includes a plurality of solar modules adapted for generating electrical power from sunlight, with each of the plurality of solar modules having substantially the same size, the same aspect ratio and the same coloring of a top surface. The plurality of solar modules are mounted on a deck of a roof to form a bank of solar modules having at least one irregular edge, such as an interior corner or an interior horizontal edge. The solar power system further includes one or more dummy panels which do not generate electrical power, but have substantially the same size, aspect ratio and top surface coloring as the solar modules, and which are adapted for installation adjacent the irregular edge. In addition, the dummy panels are also adapted for the cutting away of at least one corner thereof to reshape the bank of solar and dummy panels into a solar power system having a continuous perimeter edge without interior corners and interior horizontal edges.

Another embodiment of the present disclosure comprises an edge treatment for a roof-mounted solar power system for generating electrical power from sunlight. The edge treatment includes one or more blank panels having substantially the same size, the same aspect ratio and the same top surface coloring as the size, aspect ratio and a top surface coloring of a plurality of solar modules mounted on a deck of a roof and that together form a bank of solar modules having at least one irregular edge. The blank panels are adapted for a cutting away of at least one corner thereof to smooth the irregular edge of the bank of solar modules to a regular outside edge.

The invention will be better understood upon review of the detailed description set forth below taken in conjunction with the accompanying drawing figures, which are briefly described as follows.

DETAILED DESCRIPTION

Figures 1, 2:
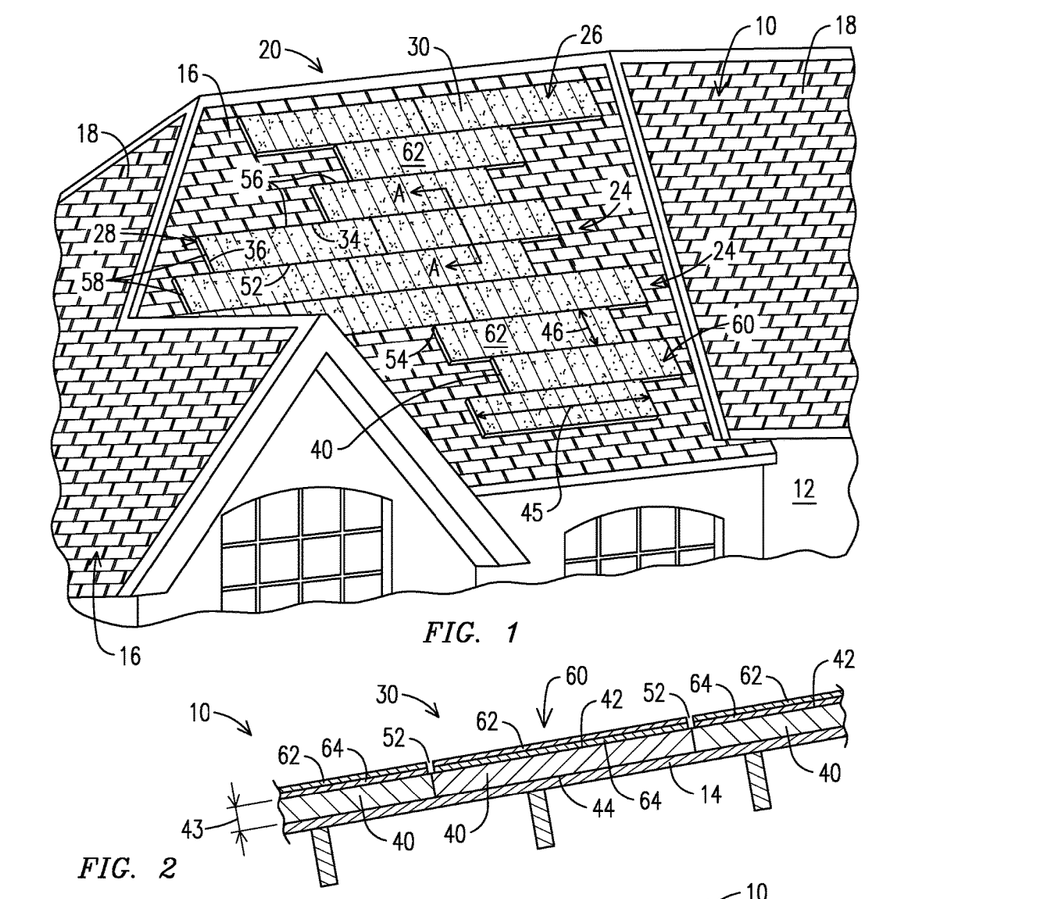
FIG. 1 is a perspective view of a solar power system for generating electrical power, in accordance with a representative embodiment.
FIG. 2 is a cross-sectional view of the solar power system of FIG. 1, as viewed from Section Line A-A.

Referring now in more detail to the drawing figures, wherein like parts are identified with like reference numerals throughout the several views, FIG. 1 illustrates a solar power system 20 for generating electrical power. The solar power system 20 can be mounted to the roof deck 14 (FIG. 2) of a building or home 12 to form a portion of the roof 10 thereof, and can include a plurality of solar modules 30 or solar shingles arranged in vertically-ascending courses 24 to form a bank of solar modules 26. As shown in FIG. 1, the bank of solar modules 26 may not cover the entire roof 10, and instead can be installed to one of several roof segments or roof planes 16 that is oriented in a direction favorable for receiving sunlight, with the remainder of the roof planes being covered with a more traditional roof covering system 18 such as asphalt roofing shingles, slate roof tiles, or ceramic roof tiles, and the like.

As shown in cross-section in FIG. 2, the solar modules 30 will generally be installed directly to the deck 14 of the roof 10 to form their own protective water-shedding and weather-resistant roof covering system. In order to form a continuous water-tight barrier that prevents water from migrating downward through the vertical seams or joints 52 between solar modules 30, the edges can be abutted against each other with an edge sealing system. In another embodiment shown in FIG. 3, the edges of the solar modules 30' can overlap each other to form downwardly inclined joints 52' that may not require additional sealing. In other aspects, the bank 26 of solar modules 30 also may be overlaid or supported on the existing roof covering system 18 which provides the water-shedding and weather-resistant barrier that protects the home 12 below (not shown).

In the embodiment of the solar power system 20 illustrated in FIGS. 1 and 2, each of the power-generating solar modules 30 can include a frame structure 40 having a top surface 42 upon which is supported a solar element 60, a bottom surface 44, and a thickness 43 between the top surface 42 and the bottom surface 44 that elevates the solar element 60 a predetermined distance above the roof deck 14. In addition, the solar element 60 may comprises a substantially-transparent glass 62 or glass-like panel that covers one or more photovoltaic cells 64 located below the glass 62.

Figure 3:
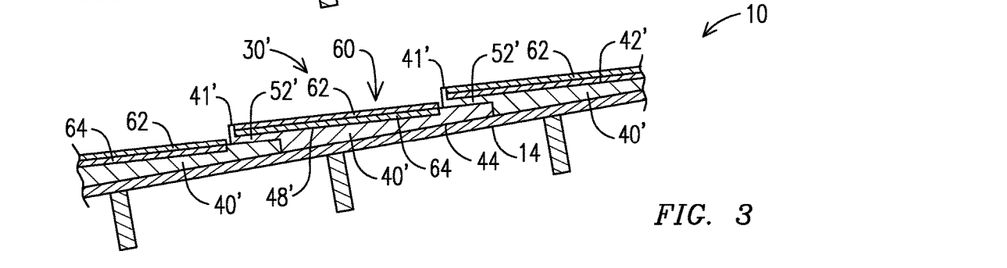
FIG. 3 is a cross-sectional view of the solar power system viewed from Section Line A-A of FIG. 1, in accordance with another representative embodiment.

As shown in FIG. 2, the solar element 60 may be positioned above the top surface 42 and extend nearly from edge-to-edge over the underlying frame 40, so that the side edges of the solar element 60 are exposed. Alternatively, as shown in FIG. 3, the solar element 60 may be positioned within an appropriately sized receptacle 48' formed into the top surface 42' of the frame 40', so that side edges of the solar element 60 are protected by encircling strips of frame material 41'. Other arrangements for supporting the solar element 60 on the frame 40 are also contemplated and considered to fall within the scope of the present disclosure. The solar element 60 generally covers as much of the top surface 42 of the frame 40 as possible to provide the greatest amount of photo-sensitive surface area per solar module 30 that is exposed to sunlight.

The solar element 60 is typically a separately-manufactured component that has been provided with a predetermined size and shape which cannot be changed or modified in the field without destroying the functionality of the solar element 60. Thus, once the solar element 60 is manufactured and mounted into the frame 40, the size and aspect ratio of the solar module 30, as well as its surface coloring which is defined by the coloring of the glass 62 or photovoltaic cells 64, may also be fixed and cannot be altered once the unit has been manufactured or assembled.

As shown in FIG. 1, each of the solar modules 30 in the bank of solar modules 26 can generally have the same length 45 and width 46. In turn, these dimensions are generally defined by the size and aspect ratio of the solar elements 60. Each of the solar modules 30 in any particular bank of solar modules 26 are generally provided with the same length 45 and width 46, both because they fit together better and because it can be significantly more cost-effective to manufacture and supply solar roofing panels in standard sizes which have been previously engineered to meet all the requirements of the solar module system 20. In one exemplary embodiment of the present disclosure, for instance, the solar modules 30 can have a length of about 65 inches and a width of about 25 inches, which may be considered a balanced solution between the size of the solar element 60 (larger solar elements generally have a lower cost per unit area than smaller solar elements) and the ease and safety for a single individual who may be tasked with handling the panel on a steeply-sloped roof on a windy day. Of course, different banks of solar modules 26 may have individual solar modules 30 with sizes and aspects ratios that vary considerably from those described above.

The roof plane 16 or roof segment upon which the bank of solar modules 26 is to be installed is likely to have a different size and shape than other roof planes, thus requiring some customization in the placement of the solar modules 30. For example, the courses of solar modules 24 can be staggered and extended across the expanse of the roof plane 16 to provide the greatest amount of coverage and exposure to sunlight, so as to maximum the power output from the bank of solar modules 26. Given the large size and aspect ratios of the individual solar modules 30, however, the outside perimeter edge 28 of the bank of solar modules 26 is likely to include one or more irregular side edges. For example, the irregular side edges can include interior corners 54, interior horizontal edges 56, and outer edges 58 that are non-parallel with an edge of the roof plane 16. These irregular side edges can be unsightly, can reduce the ability of the bank of solar modules 26 to shed water, and can increase the likelihood that rain, snow, soot, dirt and plant materials such as leaves, twigs and branches may be captured and held by the bank of solar modules 26. If not removed, the accumulated material and moisture can result in stains and/or water damage to the roof.

Figure 4:
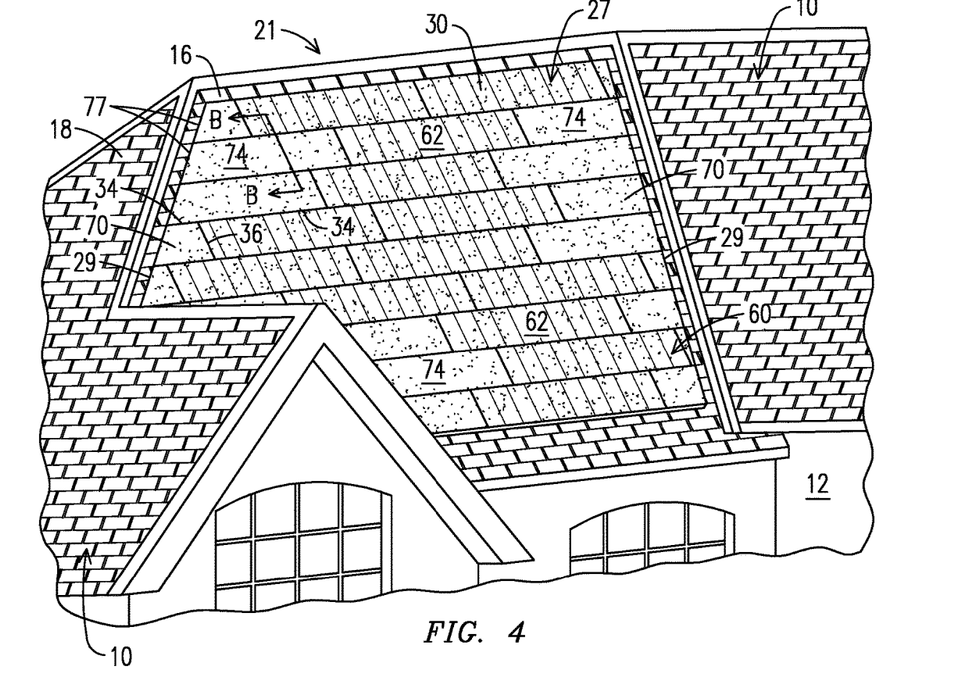
FIG. 4 is a perspective view of the solar power system of FIG. 1, in accordance with yet another representative embodiment.

To overcome these problems, in another embodiment of the solar power system 21 shown in FIG. 4, the bank 27 of solar modules 30 can be provided with edge treatments, such as one or more blank or dummy panels 70 having substantially the same size, the same aspect ratio, and the same surface coloring of a power-producing solar module 30, but without the solar element 60 and associated components needed to generate electricity from sunlight. Furthermore, each of the dummy panels 70 can be adapted for the cutting away of at least one corner thereof, and often an entire side edge or even a majority portion of the dummy panel, so that the remainder portions of the dummy panels 70 can fit within the bank 27 of solar modules 30 and adjacent to the irregular edges. As such, the frames 72 of the dummy panels 70 can align with the horizontal edges 34 and for vertical edges 36 of the solar modules 30 to fill the spaces proximate the irregular edges, while the cut edges 77 of the dummy panels 70 re-shape the perimeter of the bank 27 of solar modules 30 and dummy panels 70 to form a more-uniform and continuous outside perimeter edge 29 without interior corners and interior horizontal edges.

Figure 5:
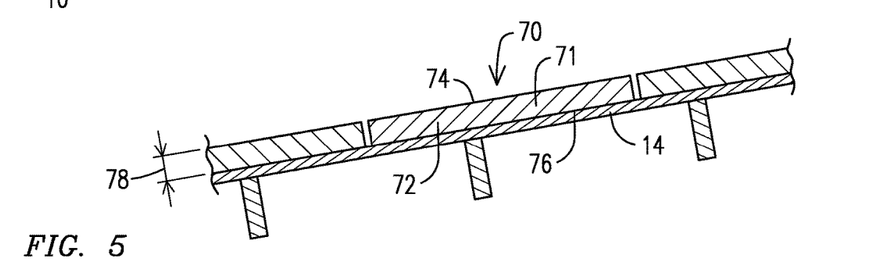
FIG. 5 is a cross-sectional view of the solar power system of FIG. 4, as viewed from Section Line B-B.
Figure 6:
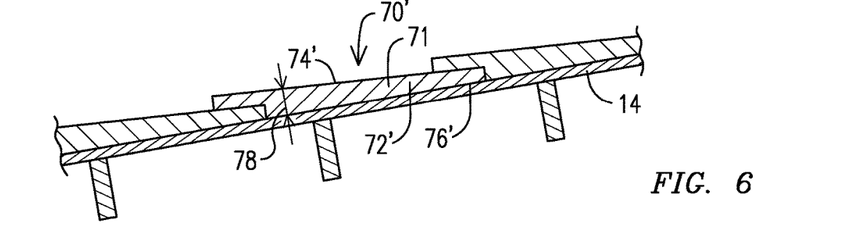
FIG. 6 is a cross-sectional view of the solar power system viewed from Section Line B-B of FIG. 4, in accordance with yet another representative embodiment.

As shown in FIGS. 5 and 6, the dummy panel can include a frame that is similar in size and shape to the frame of the solar module described above. In the edge-butting dummy panel 70 shown in FIG. 5, the frame 72 has top surface 74, a bottom surface 76, and an increased thickness 78 that substantially matches the overall thickness of the corresponding solar module shown above (FIG. 2), and with the solar element being replaced by the full-face top surface 74 which can be colored to match the appearance of the top surface 62 of the solar module 30. Similarly, the frame 72' of the dummy panel 70' with an overlapping-edge also has a top surface 74', a bottom surface 76', and an increased thickness 78' that substantially matches the thickness and profile of the corresponding solar module shown above in FIG. 3, and with the solar element also being replaced by the full-face top surface 74'. Thus, it is to be appreciated that the top surfaces 74 of the dummy panels 70 can be located at substantially the same elevations as the transparent glass 62 of the solar elements 30, and can therefore provide for a bank 27 of solar modules 30 and dummy panels 70 having top surfaces 62, 74 that are substantially uniform and planar.

Alternatively, the blank or dummy panel 70 may comprise a granulated asphaltic panel or similar product (not shown) having a thickness that is less than the thickness of the solar modules, but still having a visible top surface that is substantially the same size (i.e. surface area), the same aspect ratio and the same surface coloring as the visible top surface of the solar modules. The granulated asphaltic dummy panel is also adapted for the cutting away of a corner or side edge thereof and for installation adjacent an irregular edge of the bank of solar modules 27. In this embodiment, however, the top surface of the granulated asphaltic dummy panel may be located at an elevation that is below the elevation of the glass 62 of the solar elements 60, but can nevertheless provide the appearance, at least from a distance or through a glancing look, of a bank 27 of solar modules 30 and dummy panels 27 having a uniform and continuous outside perimeter edge 29 (FIG. 4).

In addition to having substantially the same surface coloring, the top surfaces 74 of the blank or dummy panels 70 can also mimic the appearance of the top surfaces 62 of the solar modules 30 in other respects. For instance, the top surfaces 74 can be provided with a glossy, semi-reflective surface coating that mimics the reflectivity of the glass 62 of the solar elements 60 mounted into/over the top surfaces 42 of the frames 40. As will be described in more detail below, moreover, the top surfaces 74 of the dummy panels 70 can also be provided with the same surface treatments that are applied to the top surfaces 62 of the solar modules 30, and which may operate alter the texture or appearance of the visible portions of the bank 27 of solar modules 30 and dummy panels 70.

As discussed above, each of the dummy panels 70 can be adapted for the cutting away of a corner or side edge to form a cut edge surface 77 at any angle across the width or length of the dummy panel, which can then be aligned with the horizontal edges 34 and/or vertical edges 36 of the solar modules 30. As such, the material 71 forming the dummy panel 70 can be selected or adapted to allow for the cutting process to be performed in the field using normal cutting tools. Furthermore, in some aspects a final cutting step can be performed after the dummy panel 70 has been installed onto the roof 10 and within the bank 27 of solar modules 30 and dummy panels 70, so as to provide an exact cut that that precisely matches the desired contour of the outside perimeter edge 29 of the bank 27 of modules and panels.

Consequently, as can be seen in FIG. 4, the bank 27 of solar modules 30 and dummy panels 70 can have a substantially smooth and uniform top surface which provides for the effective shedding of rain, snow and ice, as well as a uniform and continuous outside perimeter edge 29, without interior corners and interior horizontal edges, that reduces the likelihood that water, soot, dirt and plant materials may be captured and held within an outer boundary of the bank of panels 27. In addition, the capability of cutting the blank or dummy panels 70 at any angle across the width or length of the dummy panel allows for the outside edges of the bank of panels to be aligned with the corners and edges of the roof plane, which can further help to control and guide the shedding of water from the surfaces of the roof and to increase the overall structural integrity of the solar power system 21.

Figure 7:
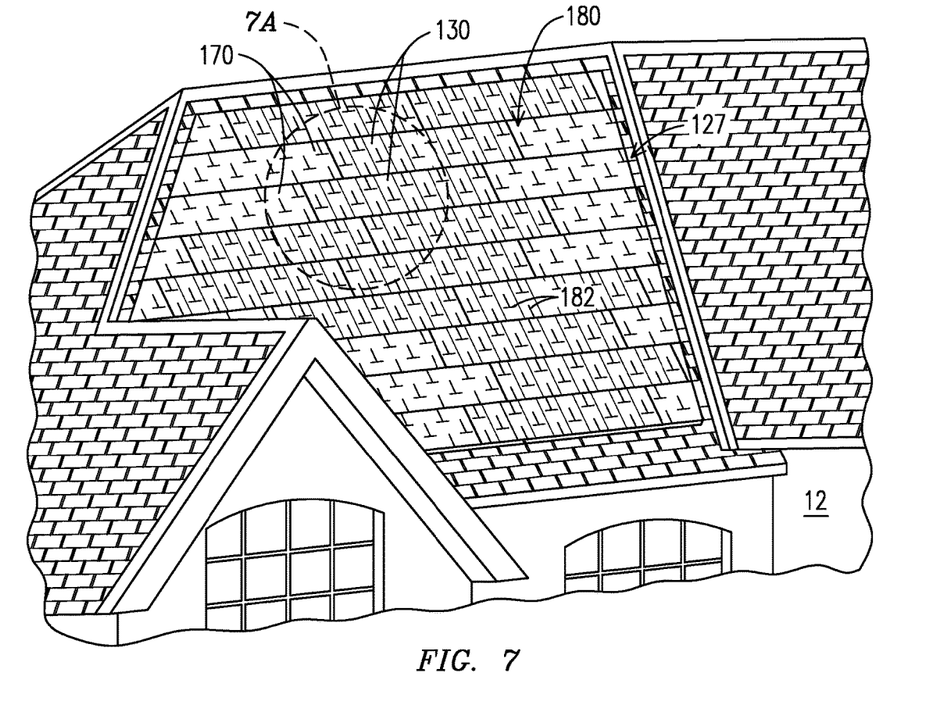
FIGS. 7 and 7A are perspective and close-up views, respectively, of the solar power system of FIG. 4, in accordance with yet another representative embodiment.
Figure 7A:
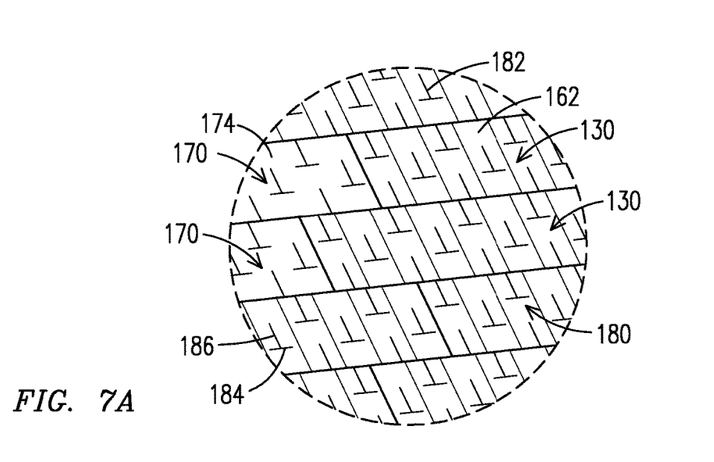

With reference now to FIGS. 7 and 7A, and in accordance with an additional representative embodiment, the top surfaces 162 of the solar modules 130 and the top surfaces 174 of the blank or dummy panels 170 in a bank 127 of solar modules 130 and dummy panels 170 can be provided with one or more surface treatments 180 that produce the appearance of a plurality of smaller, standard-sized shingles or roofing tiles to break up or hide the true size of the modules and panels. In addition, the surface treatments 180 can be configured to substantially maintain the amount of sunlight reaching the photovoltaic cells below the glass 162 of the solar modules 130 as compared to solar modules without surface treatments 180. Indeed, and without being bound to any particular theory, it is believed that the surface treatments 180 may be used to increase the efficiency or effective range of power generation of the solar modules by deflecting, diffusing or otherwise redirecting the sunlight over a broader portion of the photovoltaic cells, especially when the angle of incidence of the sunlight on the solar modules is lower during the early mornings and late afternoons.

The surface treatments 180 can take a variety of forms, including the relatively shallow surface treatments 182 shown on FIGS. 7 and 7A. These shallow surface treatments 182 can include etching a shape or texture into the glass 162 of the solar modules 130 and to the top surfaces 174 of the dummy panels 170 to create frosting elements 184 which can portray shadows or shading, as well as linear elements 186 which can portray the sharp edges of the non-existent shingles or tiles. As known to one of skill in the art, the etching may accomplished through mechanical, chemical or optical (laser) means.

Alternatively, the frosting elements 184 and linear elements 186 can also be provided through the application of paint or similar opaque material to the upper surfaces of the solar modules 130 and dummy panels 170. In one aspect, the paint can be applied in the form of tiny dots, similar in method to the application of ink with an ink-jet printer. The application of paint can further include variations in the density of the dots, such as light, medium and heavy, to provide frosting elements 184 and linear elements 186 having multiple tones or shades.

Figure 8:
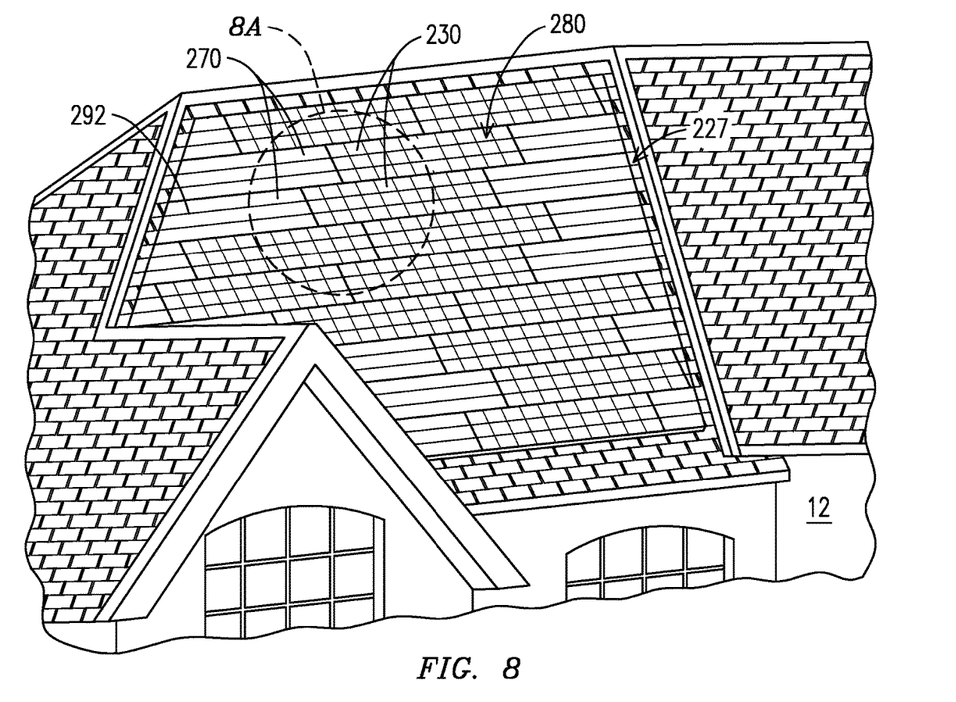
FIGS. 8 and 8A are perspective and close-up views, respectively, of the solar power system of FIG. 4, in accordance with yet another representative embodiment.
Figure 8A:
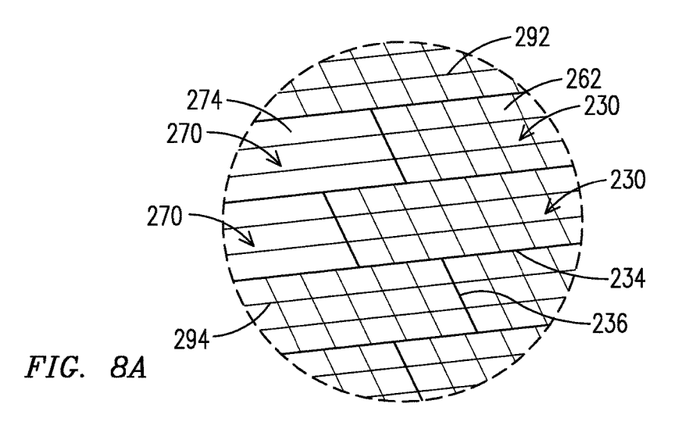

As shown in FIGS. 8 and 8A, the surface treatments 280 applied to a bank 227 of solar modules 230 and dummy panels 270 can also include deep surface treatments 292 such as linear channels or grooves 294 formed across the expanse of the glass 262 of the solar modules 230 and the top surfaces 274 of the dummy panels 270, and which extend deeper into the top surfaces than the shallow surface treatments 282 described above. In one aspect, the linear grooves 294 can optically mimic the actual horizontal edges 234 and vertical edges 236 of the panels by running parallel to the edges of the panel. This can visually break up the panels into smaller segments. In one representative embodiment the linear grooves 294 may be formed only in the horizontal direction, which can provide the appearance of elongated panels or strips of tiles. This may be especially effective when the deep surface treatments 292 of FIG. 8 are combined with the shallow surface treatments 182 of FIG. 7 to provide a complex and nuanced optical image.

The invention has been described in terms of preferred embodiments and methodologies considered by the inventors to represent the best mode of carrying out the invention. A wide variety of additions, deletions, and modification might well be made to the illustrated embodiments by skilled artisans within the scope of the invention. For example, other deep surface treatments, such as sweeping curves or shapes which extend across multiple panels, etc, as well different combinations of shallow surface treatments 182 and deep surface treatments 292 for both artistic effect and functional enhancement. These and other revisions might be made by those of skill in the art without departing from the spirit and scope of the invention, with is constrained only by the following claims.

What is claimed is:

1. A roof-mounted solar power system for generating electrical power from sunlight, the system comprising:
   a plurality of solar modules adapted for generating electrical power from sunlight, each of the solar modules having a same size, a same aspect ratio and a same coloring, each of the solar modules comprising an array of electrically interconnected side-by-side solar cells mounted to a substrate with spaces between at least some of the solar cells and a transparent protective covering overlying the array of solar cells, the transparent protective covering defining a solar module top surface, the plurality of solar modules being mounted on a deck of a roof to form a bank of solar modules having at least one irregular edge;

each solar module top surface having a surface treatment formed thereon, the surface treatment comprising a first plurality of linear grooves on the top surface extending in a first direction and a second plurality of linear grooves on the top surface extending in a second direction different from the first direction, the surface treatment overlying the array of solar cells and the spaces between solar cells, the surface treatment being configured to simulate shadows and edges of a plurality of roofing shingles or tiles and thereby visually break up or hide the true size of the solar modules; and at least one edge treatment having the same size and the same aspect ratio as the solar modules and adapted for installation adjacent the irregular edge, the at least one edge treatment being adapted for a cutting away of at least one corner thereof to smooth the irregular edge of the bank of solar modules to form a linear outside edge, and an edge treatment top surface having the same coloring as the solar module top surfaces and including a second surface treatment similar to the surface treatment of the solar module top surfaces to extend the simulated plurality of roofing shingles or tiles across the edge treatment to the linear outside edge.

2. The solar power system of claim 1, wherein each of the plurality of solar modules further comprises:

a frame having a lower side supported on the deck of the roof, an upper side, and a thickness between the lower side and the upper side, the array of solar cells and substrate being supported on the upper side of the frame above the deck of the roof.

3. The solar power system of claim 2, wherein the at least one edge treatment comprises a granulated asphaltic panel having a thickness less than the thickness of the frame of the solar modules.

4. The solar power system of claim 2, wherein the at least one edge treatment further comprises a dummy panel having a thickness equal to a thickness of the frame of the solar modules.

5. The solar power system of claim 4, wherein the dummy panel comprises a frame of a solar module having a full face surface in place of the array of solar cells.

6. A roof-mounted solar power system for generating electrical power from sunlight, the system comprising:

a plurality of solar modules mounted on a deck of a roof to form a bank of solar modules adapted for generating electrical power from sunlight, each of the plurality of solar modules having a same size and a same aspect ratio and including:

a frame having a lower side, an upper side, and a thickness between the lower side and the upper side;

a solar element supported on the upper side of the frame and including a plurality of photovoltaic cells arranged in side-by-side relationships with spaces between at least some of the photovoltaic cells, the plurality of photovoltaic cells being covered by a clear panel having a top surface, the clear panel being formed from a transparent material that allows sunlight to pass through the clear panel and impinge upon the plurality of photovoltaic cells located below;

the top surfaces of the clear panels comprising at least one surface treatment thereon, the surface treatment comprising a first plurality of linear grooves in the top surface extending in a first direction and a second plurality of linear grooves in the top surface extending an a second direction different from the first direction, the surface treatment extending over the plurality of side-by-side photovoltaic cells and over the spaces between photovoltaic cells below the clear panels and being configured to simulate visually the edges of a plurality of roofing shingles or tiles and thereby to break up or hide the true size of the solar modules.

7. The solar power system of claim 6, wherein the at least one surface treatment is configured to redirect low incident sunlight onto at least one of the plurality of photovoltaic cells below.

8. The solar power system of claim 6, wherein the at least one surface treatment comprises frosting elements configured to simulate the shadows or shading of the simulated roofing shingles or tiles.

9. The solar power system of claim 6, wherein the first direction and the second direction are substantially perpendicular.

10. The solar power system of claim 6, wherein the at least one surface treatment is etched into the top surfaces of the clear panels.

11. The solar power system of claim 6, wherein the first plurality of linear grooves comprises deep surface treatments formed of horizontal linear grooves and configured to simulate a row of roofing shingles or tiles; and the second plurality of linear grooves comprises shallower surface treatments formed of linear elements configured to simulate vertical side edges of individual shingles; and wherein the at least one surface treatment further comprises frosting elements configured to simulate shading or shadowing of individual roofing shingles or tiles.

12. The solar power system of claim 6, wherein the bank of solar modules is adjacent to a plurality of traditional roofing shingles or tiles, and wherein the at least one surface treatment forms a simulated pattern of the traditional roofing shingles or tiles across the top surfaces of the clear panels.

13. The solar power system of claim 6, further comprising an edge treatment having the same size and the same aspect ratio as a solar module, and adapted for installation adjacent an irregular inside edge of the bank of solar modules, wherein the edge treatment is further adapted for a cutting away of at least one corner thereof to smooth the irregular inside edge of the bank of solar modules to form a linear outside edge; and wherein a top surface of the edge treatment includes a second surface treatment similar to the at least one surface treatment formed on the top surfaces of the clear panels to extend the simulated plurality of roofing shingles or tiles across the edge treatment to the linear outside edge.

14. A roof-mounted solar power system for generating electrical power from sunlight, the system comprising:

a plurality of solar modules mounted on a deck of a roof to form a bank of solar modules adapted for generating electrical power from sunlight, each of the plurality of solar modules having a size and an aspect ratio and including:

a frame having a lower side, an upper side, and a thickness between the lower side and the upper side;

a solar element supported on the upper side and including a plurality of photovoltaic cells arranged in side-by-side relationship with spaces between at least some of the photovoltaic cells, the plurality of photovoltaic cells being covered by a clear panel having a top surface, the clear panel being formed from a transparent material that allows sunlight to pass through the clear panel and impinge upon the plurality of photovoltaic cells located below;

the top surfaces of the clear panels including surface treatments formed thereon the surface treatments overlying the side-by-side photovoltaic cells and the spaces between photovoltaic cells and being configured to simulate visually a plurality of roofing shingles or tiles and thereby to break up visually the true size of the solar modules, the surface treatments including:

a first plurality of linear grooves extending in a first direction and configured to suggest horizontal edges of individual roofing shingles or tiles and a second plurality of linear grooves extending in a second direction different from the first direction and configured to suggest vertical edges of individual roofing shingles or tiles; and a plurality of frosting elements configured to suggest shading and/or shadowing of individual roofing shingles or tiles.

15. A roof mounted solar power system as claimed in claim 14 wherein the first direction and the second direction are substantially perpendicular.

\* \* \* \* \*